United States Patent [19]

Black et al.

[11] 4,426,768

[45] Jan. 24, 1984

[54] ULTRA-THIN MICROELECTRONIC PRESSURE SENSORS

[75] Inventors: James F. Black, Newington; Thomas W. Grudkowski, Glastonbury; Anthony J. DeMaria, West Hartford, all of Conn.

[73] Assignee: United Technologies Corporation, Hartford, Conn.

[21] Appl. No.: 334,759

[22] Filed: Dec. 28, 1981

[51] Int. Cl.³ .................... H01L 21/20; H01L 21/22
[52] U.S. Cl. ..................................... 29/583; 29/580; 29/578; 357/26; 338/4
[58] Field of Search .................. 338/2, 4; 357/26; 29/610 SG, 589, 578, 583, 376 J, 580

[56] References Cited

U.S. PATENT DOCUMENTS 4,103,273 7/1978 Keller .................................... 338/2
4,121,334 10/1978 Wallis .................................. 29/589

Primary Examiner—Brian E. Hearn
Assistant Examiner—David A. Hey
Attorney, Agent, or Firm—M. P. Williams

[57] ABSTRACT

A plurality of thin pressure sensors are made by processing a first large wafer (20, 110) to provide a plurality of electronic devices (28, 122, 124, 125) having a characteristic which varies inversely with strain, and processing a second wafer (40) to provide a plurality of cavities (46) each registered on the second wafer so as to be registerable with a corresponding device on the first wafer. The wafers (20, 40, 110) have thick undoped silicon substrates (21, 41, 114) which are utilized as handles or carriers during the processing, and are stripped off by etching to a highly doped boron etch stop layer (22, 42, 112) when the processing has proceeded to a point where the need therefore has been satisfied. The first wafers (20, 110) are provided with a suitable pattern of borosilicate glass (except in the region where the pressure sensors are formed) so that the two wafers may be joined by a field assisted bonding at a suitable temperature in a vacuum. Electric contact to the devices is provided by holes (51, FIG. 9; 56-59, FIG. 13) through the entire wafer.

2 Claims, 13 Drawing Figures

ULTRA-THIN MICROELECTRONIC PRESSURE SENSORS

DESCRIPTION

1. Technical Field

This invention relates to pressure sensors, and more particularly to processes for manufacturing ultra-thin microelectronic pressure sensors.

2. Background Art

There is an increasing need for reliable, electronic pressure sensors which can be utilized in adverse environments, and which can be used in a manner that does not upset the environmental conditions, the pressure of which is to be measured. Recent advances in the pressure sensor art have provided pressure sensors employing surface acoustic waves, piezoelectric bridges, and bulk acoustic waves. Microelectronic processing techniques (of the sort utilized to provide large scale integrated electronic circuits) have been employed to make such pressure sensors, as well as to make capacitive pressure sensors of a very small type. However, it is desirable to provide such pressure sensors in a wide variety of types to suit a large number of applications, and therefore it is desirable to fabricate pressure sensors employing electronic devices sensitive to strain in a fashion which protect the devices, are capable of being mass produced in a reliable, reproducible fashion at relatively low cost, and which can withstand adverse environments. Heretofore, one difficulty with small, microelectronic pressure sensors is that the overall dimensions thereof have impeded the flow of gases (such as in a jet engine) or have been unable to withstand adverse environments.

DISCLOSURE OF INVENTION

Objects of the invention include provision of electronic pressure sensors which are ultra-thin, in which the electronic devices are inherently protected, and which are reproducibly mass producible at relatively low cost.

According to the invention, a first wafer including a thick undoped silicon carrier substrate and an additional doped silicon layer is processed to provide a plurality of electronic devices sensitive to strain, and is provided with a suitable coating of borosilicate glass. The first wafer is then joined by field assisted bonding to a second wafer having a thick, undoped silicon carrier substrate, in which a plurality of cavities have been formed, to provide a composite wafer having a plurality of pressure sensors, each including a device at a cavity. The wafer is diced to provide individual pressure sensors. The thick, undoped silicon carrier substrates are stripped off at appropriate stages of the process where they are no longer needed. According further to the invention, each of the wafers employs a highly doped silicon etch stop layer that facilitates stripping off the undoped silicon substrate. In still further accord with the invention, contact to the electronic devices made at a first surface of one of the wafers is achieved by etching through the entire wafer from the opposite surface thereof, thereby permitting the devices to be in that surface of the wafer which is joined to the cavity-defining wafer, thereby to protect the devices.

The invention therefore provides ultra-thin microelectronic pressure sensors, such sensors which have protected devices, and which can be manufactured in a reproducible fashion on a mass production basis at low cost.

Other objects, features and advantages of the present invention will become more apparent from the following detailed description of exemplary embodiments thereof, as illustrated in the accompanying drawings.

BEST MODE FOR CARRYING OUT THE INVENTION

Figure 1:
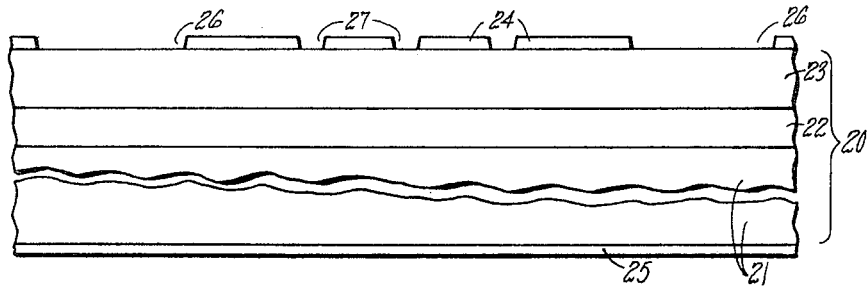
FIG. 1 is a partial, sectioned, side elevation view, of a wafer being processed to provide electronic devices in accordance with a first embodiment of the invention.
Figure 2:
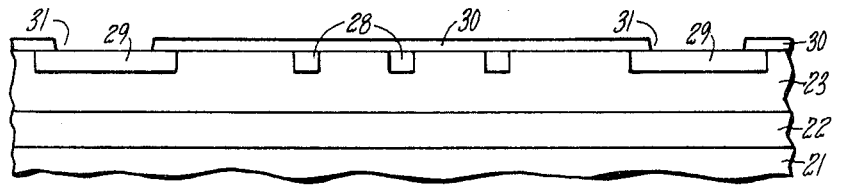
FIG. 2 is a partial, sectioned, side elevation view, of a wafer being processed to provide electronic devices in accordance with the invention, taken on the line 2—2 of FIG. 10.
Figure 10:
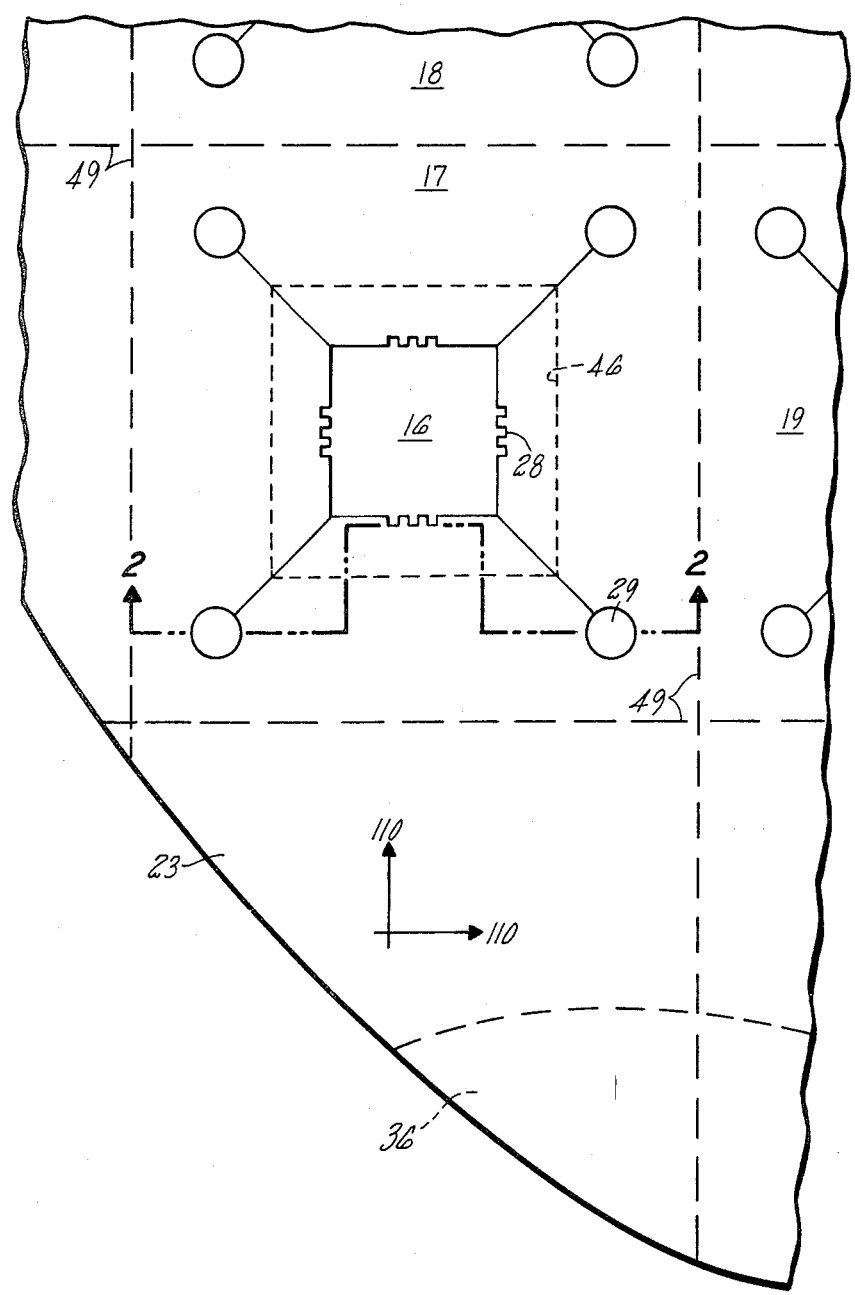
FIG. 10 is a simplified plan view of a portion of a wafer illustrating the topography of processing shown in FIG. 2.

Referring now to FIG. 10, a pair of wafers are processed to provide a plurality of piezo-resistive bridges 15 on thin diaphragms or membranes 16 so as to form a plurality of ultra-thin microelectronic pressure sensors, 17–19. It should be noted that all of the illustrations herein are not to scale, and are distorted to permit illustration of the various items and features. In FIG. 1, the starting wafer 20 is a buried layer epitaxial wafer including a lightly doped, highly resistive silicon substrate 21, having a total impurity concentration less than $10^{16}/cm^3$. The substrate 21 may be on the order of 300 microns ($300 \times 10^{-6}$cm) thick, and serves as a handle or carrier during the process, but is ultimately stripped off as is described hereinafter. The wafer 20 has a buried epitaxial layer 22 of about 3 microns thickness doped for p+ conductivity by means of a boron concentration on the order of $10^{20}/cm^3$. On the wafer 20, the upper epitaxial layer 23 is about 5 microns thick and is n− type, such as may be provided with a $10^{16}/cm^3$ concentration of phosphorus. Buried layer epitaxial wafers of this general type are commonly used for solar cells, the buried layer providing high conductivity.

The wafer 20 is oxidized in steam so as to provide silicon dioxide layers 24, 25 about 0.7 microns thick, on both surfaces thereof, which are relatively free of pinholes. Then, using standard photoresist and etch techniques, windows 26, 27 are opened in the oxide layer 24 to permit the diffusion of a resistor array 28 and bonding pads 29 (FIG. 2), respectively, to a depth of about 2 microns, by doping with boron to achieve a p− conductivity on the order of 100 ohms per square. Each resistor array 28 forms a square bridge 15 (FIG. 10), with each arm parallel to one of the two orthogonal 110 orientations of the silicon, each arm being about 0.5mm long and including 25-100 orthogonal legs of about 30 microns in length, formed by a diffusion line width of 5 microns (only 3 legs are shown in FIGS. 2-10). The bonding pads 29 may each be about 250 microns diameter. During the etching of the layer 24, photoresist should be utilized to protect the layer 25.

Figure 3:
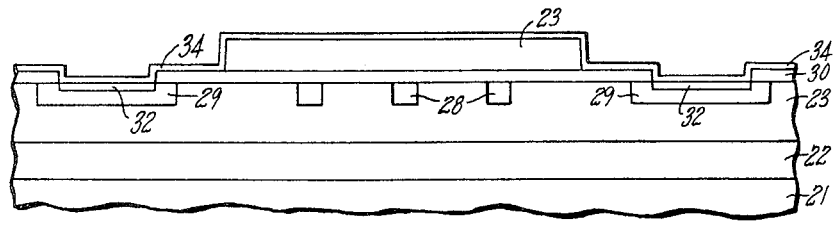
FIGS. 3–6 are partial, sectioned, side elevation views illustrating further processing of the wafer shown in FIGS. 1 and 2.
Figure 4:
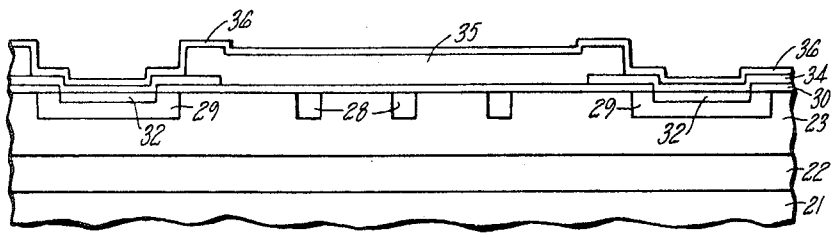

Before removing the diffusion mask registration from the wafer, the wafer is provided with edge flats or saw cuts to permit subsequent mask alignment and alignment with the second wafer, as described hereinafter. Then, remaining oxide layer 24 (FIG. 1) is stripped while taking care to protect the oxide layer 25, and a new, thin layer 30 of silicon dioxide is deposited across the entire upper surface of the wafer, such as by steam oxidation or chemical vapor deposition. This layer may be on the order of 0.2 microns thick and is permanently retained for protection of the resistors and the P/N junctions. Then, windows 31 (FIG. 2) are etched into the layer 30 (the oxide layer 25, FIG. 1, being protected with photoresist), as a first step toward providing metal bonding pads 32 (FIG. 3). The windows 31 should be smaller than the bonding pads 29 by about 25 microns in each direction. Then, plasma etching is utilized to provide a 0.5 micron deep well in each of the bonding pads. The photoresist used during the oxide etch process may be retained during the plasma etching and may remain in place while about 0.2 to 0.5 microns of aluminum is evaporated into the wells; or the photoresist may be repetitively stripped off and reapplied with the same mask. The etching of the wells and depositing of aluminum is to provide metallic bonding surface having very low resistance conductivity to the p$^-$ bonding pads 29. After removing the photoresist used in the process providing the aluminum pads 32, the wafer may be heat treated, at about 500° C. to 520° C., for a few minutes, to alloy the aluminum pads 32 with the p$^-$ diffused pads 29, to assure low resistance ohmic contact between them.

As seen in FIG. 3, the next step is to selectively apply a very thick layer of photoresist 33 above each of the resistor arrays 28 on the wafer. This photoresist layer may be on the order of 3 microns thick. Then phosphosilicate glass (PSG) is sputter deposited to a thickness on the order of 0.5 microns. This thin layer of PSG 34 is placed over the bonding pads 29, 32 to protect the P/N junctions thereof from contamination by mobile sodium ions, which accomplish field assisted bonding employing borosilicate glass, as described hereinafter. After the PSG is deposited, a swabbing etch of the photoresist will remove the photoresist and the PSG which is above the resistor arrays 28. The purpose of removing the PSG above the resistor arrays 28 is to retain the ultimate pressure responsive membrane or diaphragm as consisting essentially of silicon, so that desired design criteria for the intended pressure sensors can be predicted using silicon model information. In order to ensure protection of the P/N junctions of the diffused bonding pads 29, the PSG 34 should extend about 25 microns beyond the diffused pads 29, in each direction.

Figure 5:
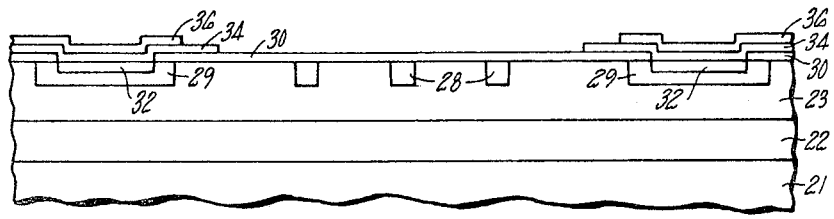
Figure 6:
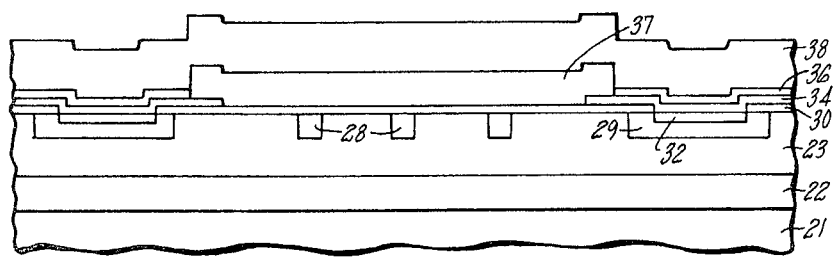

In the next series of steps, a layer of aluminum 36 (FIG. 5) is laid down over the entire wafer, except for the areas that eventually will be the pressure sensitive membranes or diaphragms 16 (FIG. 10) near the resistor arrays 28. The aluminum layer 36 extends through the interstices between the various units being fabricated on the wafer, as well as over the areas of the bonding pads 29, 32 of each device. A lift-off process is used in which another thick coating of photo-resist 35 (FIG 4) is applied in the area above the resistors 28, and extending slightly over the PSG layer 34. Then a layer of aluminum 36 of about 0.5 micron thickness is evaporated over the entire wafer. Using a scrub etch, lift-off of the aluminum above the photoresist 35 is achieved. This leaves the wafer as illustrated in FIG. 5, comprising the resistor arrays 28 and diffused bonding pads 29 with aluminum bonding pads 32 deposited therein, the entire wafer having a layer of phosphosilicate glass 34 and additional aluminum 36 thereover, except over the resistor arrays 28, which have only the thin silicon dioxide layer 30 thereover.

The final steps in preparing the first wafer are to provide borosilicate glass all over the wafer, except over the resistor arrays 28. For that reason, another layer of photoresist 37 (FIG. 6) is selectively deposited over the area of the wafer which is to be the pressure sensitive membrane or diaphragm 16 (FIG. 10), extending slightly over the phosphosilicate glass layer 34. Then, 4 or 5 microns of a suitable borosilicate glass, such as Corning 7070 or 7740 (Pyrex), is deposited in a layer 38; this will allow field assisted bonding of the first wafer 20 with a second wafer so as to form a composite microelectronic pressure sensor in accordance with the invention, as described hereinafter. After the borosilicate glass layer 38 is deposited, a scrubbing etch is used to lift off that portion of it which is above the photoresist layer 37. If difficulty is encountered in the lift-off of the unwanted borosilicate glass 38, the borosilicate glass may be deposited in several thin layers with a scrub etch between each deposition, or a suitable selective etching process may be used, provided that care is taken not to etch through the silicon dioxide layer 30 above the resistor arrays 28. After the lift-off, leaving the borosilicate glass all over the wafer except above the resistor arrays 28, the wafer 20 has the appearance illustrated in FIG. 8, where it is inverted.

Figure 7:
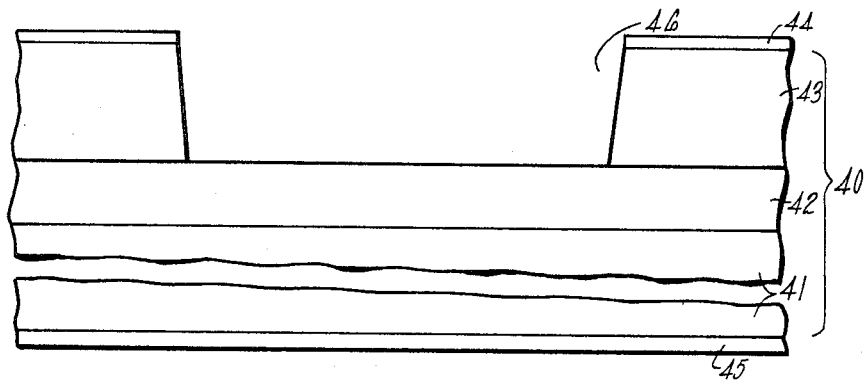
FIG. 7 is a partial, sectioned, side elevation view of a second wafer being processed in accordance with the present invention.
Figure 8:
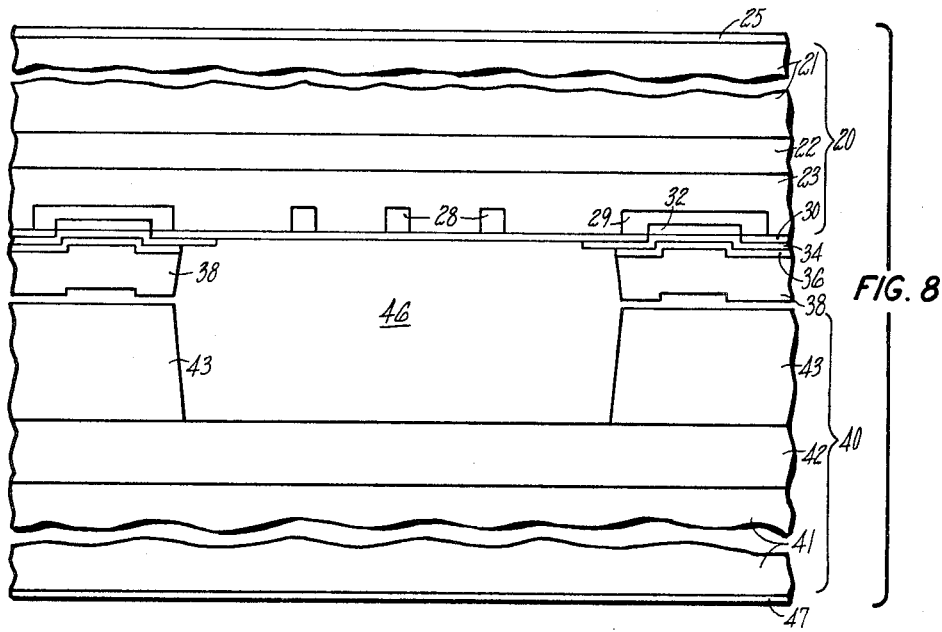
FIGS. 8 and 9 are partial, sectioned, side elevation views of combining the wafers processed in accordance with FIGS. 1–7.

A second wafer is prepared in a manner described with respect to FIGS. 7 and 8. In FIG. 7, a buried layer epitaxial wafer 40 includes a highly resistive undoped silicon substrate 41 (similar to the substrate 21 in the wafer 20) which may be on the order of 300 microns thick and serves, temporarily as a handle or carrier during the initial processing of the wafer 40. The buried epitaxial layer 42 is a p$^+$ type layer doped with boron, similar to the layer 22 in the wafer 20, and may be on the order of 5 microns thick. The upper layer 43 is highly resistive undoped silicon, the same as the substrate layer 41, and may be on the order of 10 microns thick. The wafer 40 is oxidized in steam to provide two layers 44, 45 of silicon dioxide on the upper and lower surfaces of the wafer 40, each of which may be on the order of 0.7 microns in thickness. The layer 44 has a plurality of windows photoetched therein (while protecting oxide layer 45), each defining a cavity which is to register with a corresponding array of resistors 28 in the wafer 20. And then a standard ethylene diamene pyrocatechol and water mixture (EDPW) is utilized for 15 to 30 minutes to chemically etch away those portions of the undoped silicon layer 43 which are to form cavities 46 in the finished composite pressure sensor as described hereinafter. If desired, the standard EDPW etch can be speeded up by mixing with a catalyst such as quinoxalene so as to reduce the etching time and to provide a more uniform surface in the p+ layer 42 following the etch. During the etching processes, one aspect of the invention is that the p+ boron layer 42 acts as an etch stop since the rate of etching silicon heavily doped with boron is about one hundred times slower than the rate of etching lightly doped silicon (layer 43).

After etching all of the cavities 46, while the wafer is still in its original registration, the wafer 40 is suitably shaped with 90° offset etch flats or saw cuts so as to be registerable properly with the wafer 20. Then any remaining silicon dioxide in the layers 44, 45 is stripped from the top and bottom surfaces. Then a thin layer of aluminum 47 (FIG. 8), which may be on the order of 0.2 microns to 0.5 microns thick, is evaporated across the entire bottom surface of the wafer 40, and the wafer 40 is heat treated at about 500° C. for a few minutes to form a low resistive ohmic contact between the layer 47 and the undoped silicon substrate 41. The purpose of the layer 47 is to apply a uniform electric field with respect to the patterned aluminum layer 36 in the wafer 20, as the two wafers are joined by field assisted bonding.

Referring to FIG. 8, the wafer 20 is shown inverted from its position in FIGS. 1–6, and registered with respect to the wafer 40 so that each of the cavities 46 in the wafer 40 is aligned with a corresponding membrane or diaphragm portion of the wafer 20 adjacent to the resistor arrays 28. At some remote part of the wafer 20, buffered hydrofluoric acid, EDPW and ammonia may be used to provide a window through the oxide 25 followed by use of plasma etching to provide a window through the undoped silicon substrate 21, the p+ epitaxial layer 22, the n− epitaxial layer 23, the silicon dioxide passivation layer 30 and the phosphosilicate glass layer 34, so as to permit making electrical contact with the aluminum layer 36 (see FIG. 10). The aluminum layer 36 appears everywhere in the wafer 20 except in the regions near the resistor arrays 28. With the aluminum layer 47 of the wafer 40 connected to the positive side of a 40 to 50 volt DC supply, and the aluminum layer 36 connected to the negative side, fields will exist between the two wafers everywhere except across the cavities 46. The wafers are heated to about 350° C. in a vacuum of about $10^{-4}$ Torr, and then the voltage is applied between the aluminum layers 36, 47. This causes the two wafers to be attracted to each other and to seal tightly, the borosilicate glass 38 bonding with the undoped silicon layer 43, in which the cavities 46 are formed. Since field assisted bonding is not well suited to join borosilicate glass to metal, and since it cannot be performed through phosphosilicate glass, the borosilicate glass is preferably applied to the wafer 20, and not to the wafer 40.

After the wafers 20, 40 are sealed together by field assisted bonding, the resultant composite wafer (as seen in FIG. 8) includes a plurality of cavities 46 disposed adjacent corresponding resistor arrays 28, so as to form a plurality of absolute pressure sensors. Then, the aluminum layer 47 is stripped off the bottom surface of the wafer 40, such as by immersion in hydrochloric acid. The entire undoped silicon substrate 41 of the wafer 40 is etched off in EDPW (perhaps with some quinoxalene catalyst) at about 115° C. for several hours. This will etch through the silicon until it reaches the p+ layer 42, which acts as an etch stop. A bonding layer 48 (about 3 microns thick) of gold-germanium eutectic is RF sputtered on the exposed lower surface of the p+ etch stop 42. This completes processing of the composite wafer.

Figure 9:
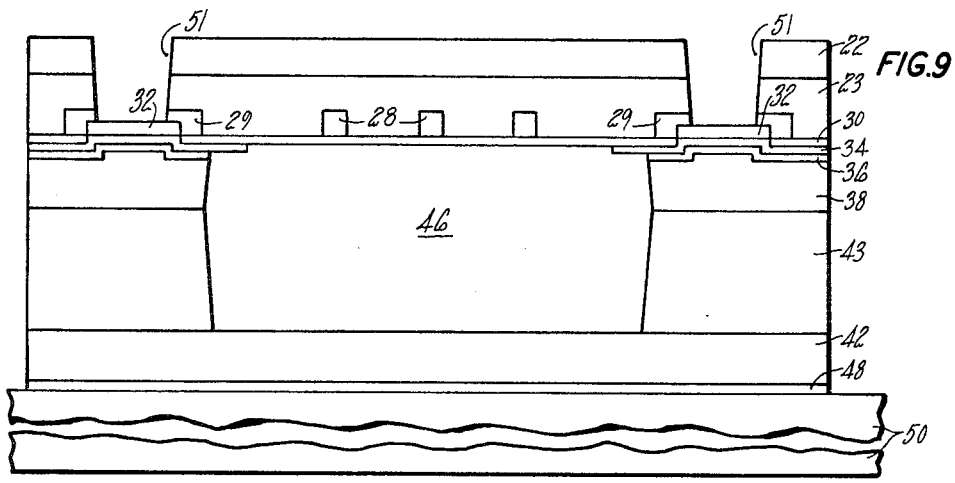

The composite wafer is then sawed into individual chips (FIG. 9), such as along the dash lines 49, FIG. 10. All remaining processing is performed individually on each chip, although several chips may be processed at one time in various steps, as is known in the art. Each chip is vacuum bonded at about 350° C. to a piece of gold-plated molybdenum shim stock 50 (FIG. 9), which may be on the order of 25 microns thick. This serves as a carrier for the pressure sensor during the remaining processing and also permits utilization of the pressure sensor in some particular applications described hereinafter. The chip is then immersed in hydrofluoric acid for a few minutes to remove the silicon dioxide layer 25 on the upper surface of the wafer 20 (FIG. 8), and then the entire chip is immersed in EDPW for several hours to remove the undoped silicon substrate 21 (FIG. 8) down to the p+ etch stop 22 (FIG. 9). Then, a thin photoresist is laid down over the upper surface of the layer 22 (FIG. 9) and the lower surface of the molybdenum shim stock 50; windows 51 are opened in the photoresist above the aluminum bonding pads 32; and each chip is plasma etched, with a freon gas formulation such as PDE-100, through the p+ etch stop 22, the n− layer 23, the p− diffused bonding pads 29, to the aluminum bonding pad 32, which acts as an etch stop. This exposes the aluminum bonding pads 32 to permit ultrasound or stitch bonding of conductors (not shown) to the aluminum bonding pads 32. The conductors may then be secured in a desired fashion to the molybdenum shim stock 50 with a suitable epoxy. The entire chip should not be encapsulated with a protective coating of epoxy since that would desensitize the diaphragm 16. Pressure sensors in accordance with the present invention, being only on the order of 55–60 microns thick, are particularly useful, for instance, to sense pressure at particular points within gas turbines, and may therefore be metallic eutectic bonded directly to blades and vanes within the engine. In such case, the bottom surface of the molybdenum shim stock 50 (FIG. 9) should be kept clean for bonding to other metal surfaces.

Figure 11:
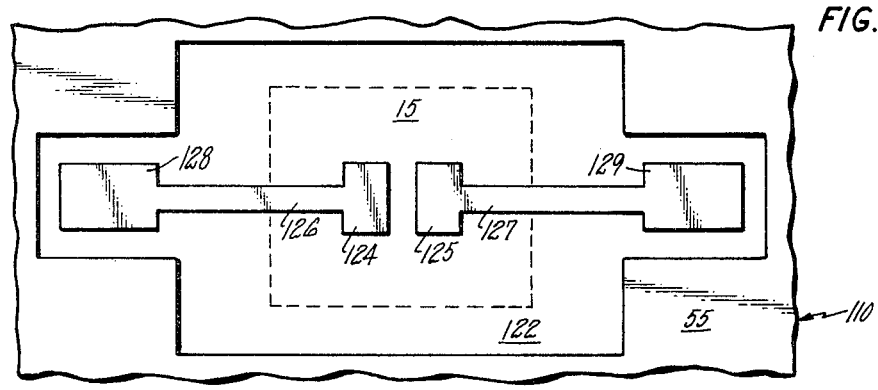
FIG. 11 is a partial plan view of a wafer being processed to provide a device in accordance with a second embodiment of the invention.
Figure 12:
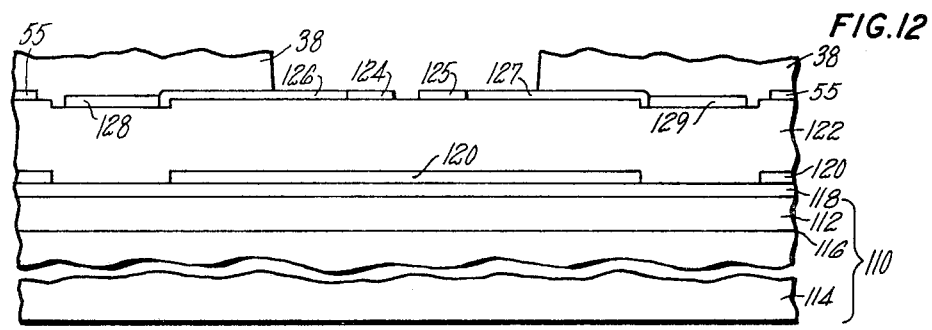
FIG. 12 is a partial, sectioned, side elevation view of the processing illustrated in FIG. 11.
Figure 13:
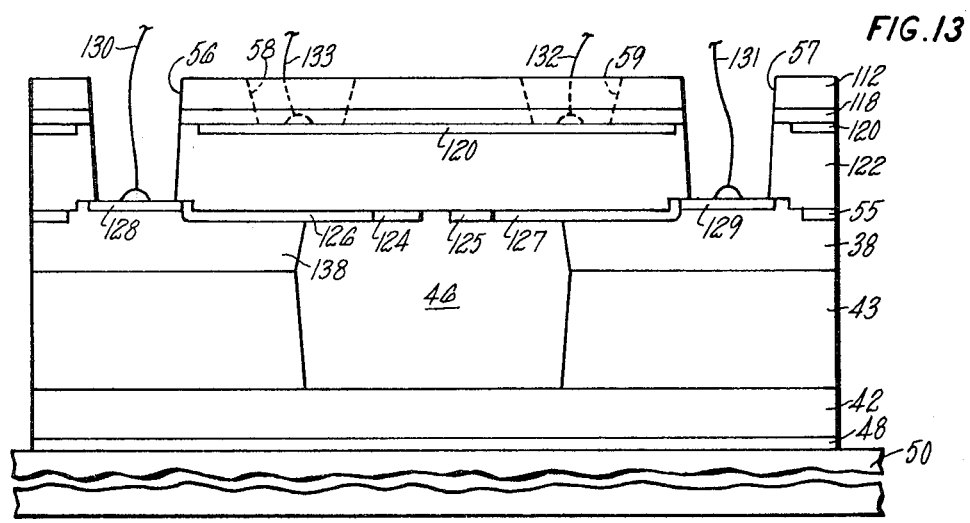
FIG. 13 is a partial, sectioned, side elevation view of combining the wafer of FIGS. 11 and 12 with the wafer of FIG. 7.

Another embodiment of the invention is illustrated in FIGS. 11–13. This utilizes a fundamental mode bulk acoustic wave device, in place of the piezo-resistive bridge. The device and the manner of making it are fully set forth in a commonly owned copending U.S. patent application entitled Fundamental, Longitudinal, Thickness Mode Bulk Wave Resonator, U.S. Ser. No. 203,211, filed on Nov. 3, 1980 by Black et al, now U.S. Pat. No. 4,320,365, which is incorporated herein by reference. To facilitate correlation of the brief description of such device herein and the more extensive description in the aforementioned application, reference numerals used in FIGS. 11–13 which correspond exactly or substantially with reference numerals in the aforementioned application are in a three digit, one hundred series, the last two digits of which in this description correspond to the reference numerals in the aforementioned application. Thus, reference to a wafer 110 herein corresponds to the wafer 10 in the aforementioned application, etc.

Referring to FIGS. 11 and 12, an epitaxial wafer 110 comprises a p+ layer 112 highly doped with boron, to act as an etch stop as described hereinbefore, and an undoped highly resistive thick silicon substrate 114 joined at the line 116. A silicon dioxide isolation layer 118 is grown thereon, after which a counterelectrode or ground plane 120 is deposited. This may preferably comprise a layer of gold sandwiched between thin layers of titanium. Then a thick layer of zinc oxide 122 is deposited by RF diode sputtering. This provides the medium in which the bulk acoustic wave will subsist. On top of the zinc oxide, a chromium-aluminum-chromium film is deposited so as to provide a pair of closely spaced electrodes 124, 125 with corresponding connectors 126, 127 leading to bonding pads 128, 129. The chromium-aluminum-chromium film also provides a conductive plane 55 everywhere on the wafer except where the devices are formed in the vicinity of the region which will become the diaphragm 15; the conductive plane 55 serves to facilitate the field assisted bonding. A photoresist lift-off (or other suitable process) is used to provide a layer 38 of borosilicate glass (to permit that part of the wafer which forms the diaphragm 15 (FIG. 11)) adjacent the cavity 46 (FIG. 13). On some remote part of the wafer, which is out of the way, plasma etching may be utilized to make contact with the layer 55, in the same fashion as contact was made with the layer 36, in order to impress the suitable voltage for field assisted bonding, as is described hereinbefore with respect to the embodiment of FIGS. 7-9.

A second wafer 40 is prepared as described hereinbefore with respect to FIGS. 7 and 8, and then the wafer 110, processed as described with respect to FIGS. 11 and 12, is registered with the wafer 40. The two wafers are joined by field assisted bonding and the composite wafer is further processed, as illustrated in FIG. 13, in the same fashion as described hereinbefore with respect to FIGS. 8 and 9. The edge of the wafer is coated with epoxy to protect the zinc oxide 122 from EDPW used to etch away the substrate 114. Ultimately, the undoped silicon substrate 114 (FIG. 12) is stripped off in the same fashion as the substrate 21 is stripped in the preceding embodiment, and a plurality of access holes 56–59 are plasma etched to the various layers (in the same fashion as providing the access holes of FIG. 9) to permit bonding suitable leads 130–133 for making contact with the pads 128, 129 and with the counterelectrode or ground plane 120. The access holes 58, 59 must be away from the diaphragm 15; they are shown in FIG. 13 as being above and beyond the view of FIG. 11. The individual devices should have their access holes 56–59 and their edges suitably protected with glass or epoxy to protect the zinc oxide layer 122.

Thus the invention may be utilized with respect to piezo-resistive bridges or bulk acoustic wave devices. Similarly, the invention may be utilized in a case where the devices that provide an electrical characteristic which varies with strain may be suitable surface acoustic wave devices, piezoelectric devices (formed from films of zinc oxide), or other electronic devices.

Although the invention has been shown and described with respect to exemplary embodiments thereof, it should be understood by those skilled in the art that the foregoing and various other changes, omissions and additions may be made therein and thereto without departing from the spirit and the scope of the invention.

We claim:

1. A method of forming a plurality of ultra-thin microelectronic pressure sensors comprising:

processing a first wafer having a first thick undoped silicon substrate extending from a first surface of said first wafer and a first highly doped silicon etch stop layer adjacent to said substrate to provide a plurality of devices at a second surface of said first wafer, each of which provides an electrical characteristic which varies with strain at said second surface;

providing a layer of borosilicate glass over the entire second surface of said first wafer except in the regions where said devices are formed;

processing a second wafer having a second thick undoped silicon substrate extending from a first surface of said second wafer and a second highly doped silicon etch stop layer adjacent to said substrate to provide a plurality of cavities in said second wafer extending from a second surface of said second wafer, each of said cavities disposed on said second wafer so that, with said first and second wafers properly registered with their second surfaces adjacent one another, each of said devices will be disposed adjacent to a corresponding one of said cavities;

contacting the borosilicate glass layer of said first wafer with said second surface of said second wafer, with said wafers registered so that each of said cavities is adjacent to a corresponding one of said devices;

joining said wafers by field assisted bonding in a vacuum to provide a composite wafer including a plurality of absolute pressure sensors, each formed by a corresponding set of a device and a cavity;

stripping said second undoped silicon substrate from said composite wafer by etching from said first surface of said second wafer to said second etch stop layer;

cutting said composite wafer into a plurality of chips, each having one of said pressure sensors;

bonding each of said chips to a metallic carrier;

stripping said first undoped silicon substrate from each of said chips by etching from said first surface of said first wafer to said first etch stop layer; and providing conductors on each of said chips to make electrical contact with the devices thereon.

2. A method of forming a plurality of ultra-thin, composite microelectronic devices comprising:

processing a first wafer having a thick undoped silicon substrate extending from a first surface of said first wafer and a highly doped silicon etch stop layer adjacent to said substrate to provide a plurality of electronic devices at a second surface of said first wafer;

providing a layer of borosilicate glass over the entire second surface of said first wafer except in the regions where said devices are formed;

processing a second wafer to provide a plurality of cavities in said second wafer extending from a second surface of said second wafer, each of said cavities disposed on said second wafer so that, with said first and second wafers properly registered with their second surfaces adjacent one another, each of said devices will be disposed adjacent to a corresponding one of said cavities;

contacting the borosilicate glass layer of said first wafer with said second surface of said second wafer, with said wafers registered so that each of said cavities is adjacent to a corresponding one of said devices;

joining said wafers by field assisted bonding in a vacuum to provide a composite wafer including a plurality of said devices each formed on a surface adjacent a corresponding cavity;

cutting said composite wafers into a plurality of chips, each having one of said devices;

stripping said first undoped silicon substrate from each of said chips by etching from said first surface to said etch stop layer;

etching through said chips from the surface of said etch stop layer which became exposed by stripping of said substrate to the electronic device on said chip, thereby to form access holes; and attaching electrical conductors to the devices on said chips through said access holes.

* * * * *